(12) United States Patent
Petersen et al.

(10) Patent No.: US 7,692,930 B2
(45) Date of Patent: Apr. 6, 2010

(54) LOW PROFILE DIMM BOARD

(75) Inventors: Christian Petersen, Allen, TX (US);
Robert J. Blakely, Ft. Collins, CO (US);
Ray Woodward, Windsor, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 344 days.

(21) Appl. No.: 11/831,377

(22) Filed: Jul. 31, 2007

(65) Prior Publication Data
US 2009/0034216 A1  Feb. 5, 2009

(51) Int. Cl.
*H05K 1/18* (2006.01)

(52) U.S. Cl. ...................... 361/761; 174/253

(58) Field of Classification Search ............ 361/761, 361/748, 749, 760; 174/253, 254, 260; 439/64, 439/76.1, 327; 29/832, 841, 842
See application file for complete search history.

(56) References Cited

U.S. PATENT DOCUMENTS

| 5,335,146 | A | * | 8/1994 | Stucke | 361/785 |
| 6,392,142 | B1 | * | 5/2002 | Uzuka et al. | 174/541 |
| 7,269,025 | B2 | * | 9/2007 | David | 361/760 |
| 2007/0236901 | A1 | * | 10/2007 | Grundy et al. | 361/785 |

* cited by examiner

*Primary Examiner*—Jeremy C Norris
*Assistant Examiner*—Yuriy Semenenko

(57) ABSTRACT

A primary memory board is disclosed. The primary memory board comprises a printed circuit board (PCB) having a front side and a back side, a plurality of DIMM surface mount connectors, and at least one component. The plurality of DIMM surface mount connectors are mounted on the front side of the PCB. The at least one component is mounted on the back side of the PCB and is positioned opposite the location of at least one of the plurality of DIMM surface mount connectors mounted on the front side of the PCB.

11 Claims, 1 Drawing Sheet

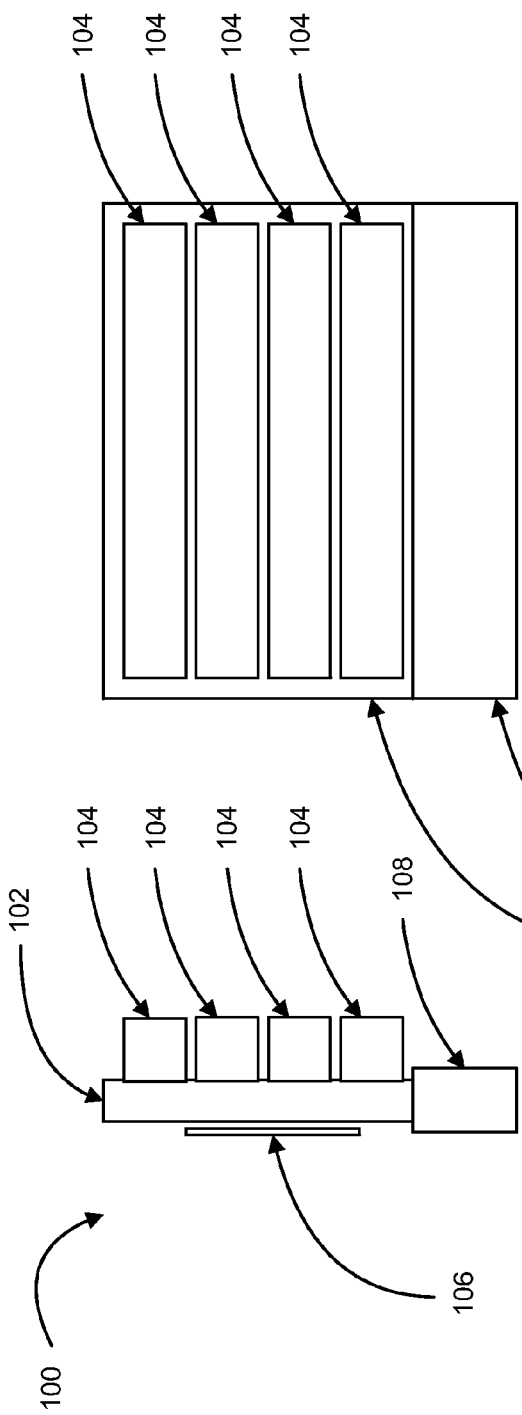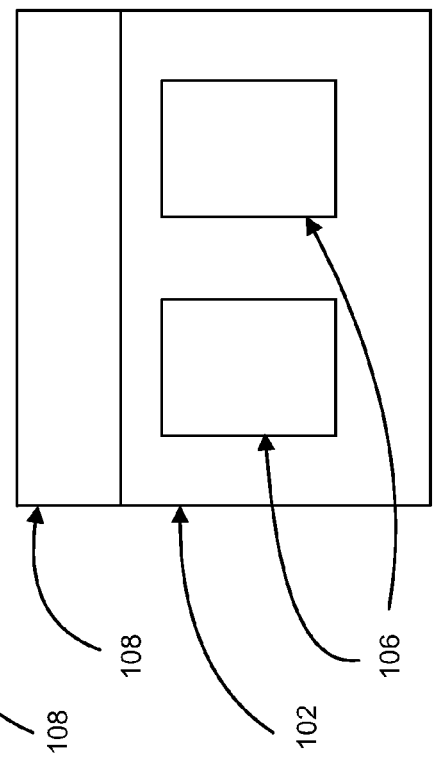

LOW PROFILE DIMM BOARD

BACKGROUND

Computer memory systems typically have a main or primary memory board and a plurality of secondary memory boards or memory components, for example dual in-line memory modules (DIMMs). The secondary memory boards are inserted into slots or connectors loaded onto the main or primary memory board. Typical memory subsystem implementations place all the connectors for the DIMMs and all the supporting components, such as buffer chips, on one side of the main memory board. Because the density in servers is increasing the available real estate for the memory subsystem is decreasing. Having all the connectors and components on one side of the main memory board limits the number of secondary boards that can be loaded onto a given sized main memory board.

DIMMs come in a number of different types. Some DIMMs use mainstream commodity DIMM technology. Other DIMMs use more expensive custom technologies. DIMMs that use the mainstream commodity DIMM technology are typically cheaper than DIMMs that use the custom technology. DIMMs that use the mainstream commodity DIMM technology typically require buffer chips to be loaded onto the main memory boards along with the DIMM connectors. DIMMs that use the custom technologies typically have buffer chips intergraded into the DIMM chips. Because the buffer chips are intergraded into the DIMMs the buffer chips are not required on the main memory boards and the DIMM connectors can be packed into a smaller volume.

BRIEF DESCRIPTION OF THE DRAWINGS

FIG. 1A is a back view of primary memory board 100 in an example embodiment of the invention.

FIG. 1B is a front view of primary memory board 100 in an example embodiment of the invention.

FIG. 1C is a side view of primary memory board 100 in an example embodiment of the invention

DETAILED DESCRIPTION

FIG. 1 and the following description depict specific examples to teach those skilled in the art how to make and use the best mode of the invention. For the purpose of teaching inventive principles, some conventional aspects have been simplified or omitted. Those skilled in the art will appreciate variations from these examples that fall within the scope of the invention. Those skilled in the art will appreciate that the features described below can be combined in various ways to form multiple variations of the invention. As a result, the invention is not limited to the specific examples described below, but only by the claims and their equivalents.

FIG. 1C is a side view of primary memory board 100 in an example embodiment of the invention. Primary memory board 100 comprises printed circuit board (PCB) 102, surface mount connectors 104, board components 106, and edge connector 108. Surface mount connectors 104 are mounted on the front side of PCB 102. Board components 106 are mounted on the back side of PCB 102. Edge connector 108 is mounted onto bottom edge of PCB 102 and configured to couple primary memory board 100 onto a server. Surface mount connectors 104 are configured to accept secondary memory boards, for example DIMMs.

Surface mount connectors 104 use up space on only one side of PCB 102, unlike normal through-hole or press fit DIMM connectors that would use up space on both sides of PCB 102. Because surface mount connectors 104 only use up space on the front side of PCB 102, the back side of PCB 102 has space that is available for use. This allows board components 106 to be mounted onto the back side of PCB 102. Creating space on the back side of PCB 102 allows essentially all the space on the front side of PCB 102 to be dedicated to mounting secondary memory boards. Because space is available on the back side of BCP 102, board components 106, for example buffer chips, can be mounted onto the back side of PCB 102. Because space is available for buffer chips on the back side of PCB 102, the DIMM connectors can be packed tightly together without using the more expensive custom technologies for the DIMMs. This allows the mainstream commodity DIMM chips to be packed tightly and helps maximize memory density without resorting to custom DIMMs.

FIG. 1B is a front view of primary memory board 100 in an example embodiment of the invention. Surface mount connectors 104 are mounted onto front side of PCB 102. Surface mount connectors 104 take up essentially all the available surface area of front side of PCB 102, thereby maximizing the number of DIMMs that can be loaded onto primary memory board 100 in a given space.

FIG. 1A is a back view of primary memory board 100 in an example embodiment of the invention. Board components 106 are mounted onto back side of PCB 102. Board components 106 typically connect to PCB 102 along the edges of board components 106. Some parts of the edges of board components 106 are underneath the surface mount connectors 104 located on the front side of PCB 102. Because surface mount connectors 104 are located on the opposite side of PCB 102 from the board components, through hole connectors can not be used for mounting the board components 106 onto PCB 102. Blind or buried vias must be used to couple the board components 106 into PCB 102. By mounting board components onto the back side of PCB 102, commodity DIMMs may be used in primary memory board 100.

What is claimed is:

1. A primary memory board, comprising:
    a printed circuit board (PCB) having a front side and a back side;
    a plurality of DIMM surface mount connectors mounted on the front side of the PCB;
    at least one component mounted on the back side of the PCB wherein the at least one component is positioned opposite a location of at least one of the plurality of DIMM surface mount connectors mounted on the front side of the PCB, and wherein the at least one component is a buffer chip.

2. The primary memory board of claim 1, further comprising:
    at least one blind vias configured to connect at least one trace on the at least one component to the PCB.

3. The primary memory board of claim 1, further comprising:
    a plurality of DIMMs mounted into the plurality of DIMM surface mount connectors wherein the plurality of DIMMs use mainstream commodity DIMM technology.

4. The primary memory board of claim 1, wherein the plurality of DIMM surface mount connectors occupy essentially all the available area on the front side of PCB.

5. The primary memory board of claim 1, further comprising:
    an edge connector loaded onto an edge of PCB wherein the edge connector is coupled to a server.

6. A method for fabricating a primary memory board, comprising:

installing a plurality of DIMM surface mount connectors on a front side of a printed circuit board (PCB);

mounting at least one component on a back side of the PCB wherein the at least one component is positioned opposite a location of at least one of the plurality of DIMM surface mount connectors mounted on the front side of the PCB, and wherein the at least one component is a buffer chip.

7. The method for fabricating a primary memory board of claim 6, further comprising:

connecting at least one trace on the at least one component to the PCB using at least one buried vias.

8. The method for fabricating a primary memory board of claim 6, wherein the plurality of DIMM surface mount connectors occupy essentially all the available area on the front side of PCB.

9. The method for fabricating a primary memory board of claim 6, further comprising:

mounting a plurality of DIMMs into the plurality of DIMM surface mount connectors wherein the plurality of DIMMs use mainstream commodity DIMM technology.

10. The method for fabricating a primary memory board of claim 6, further comprising:

mounting an edge connector onto an edge of PCB;

coupling the edge connector to a server.

11. A primary memory board, comprising:

a printed circuit board (PCB) having a front side and a back side;

a means for mounting a plurality of DIMMs onto the front side of the PCB;

at least one component mounted on the back side of the PCB wherein the at least one component is positioned opposite the means for mounting the plurality of DIMMs, and wherein the at least one component is a buffer chip.

* * * * *

UNITED STATES PATENT AND TRADEMARK OFFICE
CERTIFICATE OF CORRECTION

| | | |
|---|---|---|
| PATENT NO. | : 7,692,930 B2 | Page 1 of 1 |
| APPLICATION NO. | : 11/831377 | |
| DATED | : April 6, 2010 | |
| INVENTOR(S) | : Christian Petersen et al. | |

It is certified that error appears in the above-identified patent and that said Letters Patent is hereby corrected as shown below:

In column 3, line 2, in Claim 6, delete "hoard" and insert -- board --, therefor.

Signed and Sealed this

Twenty-ninth Day of June, 2010

David J. Kappos
*Director of the United States Patent and Trademark Office*